United States Patent
Cheng et al.

(10) Patent No.: US 9,559,165 B2
(45) Date of Patent: Jan. 31, 2017

(54) SEMICONDUCTOR STRUCTURE WITH STRAINED SOURCE AND DRAIN STRUCTURES AND METHOD FOR FORMING THE SAME

(71) Applicant: Taiwan Semiconductor Manufacturing Co., Ltd, Hsin-Chu (TW)

(72) Inventors: Tung-Wen Cheng, Hsinchu (TW); Chang-Yin Chen, Taipei (TW); Che-Cheng Chang, New Taipei (TW); Mu-Tsang Lin, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/490,838

(22) Filed: Sep. 19, 2014

(65) Prior Publication Data

US 2016/0087037 A1    Mar. 24, 2016

(51) Int. Cl.
| | |
|---|---|
| *H01L 29/78* | (2006.01) |
| *H01L 21/8238* | (2006.01) |
| *H01L 21/336* | (2006.01) |
| *H01L 27/092* | (2006.01) |
| *H01L 29/161* | (2006.01) |
| *H01L 21/20* | (2006.01) |
| *H01L 21/302* | (2006.01) |
| *H01L 29/08* | (2006.01) |

(Continued)

(52) U.S. Cl.
CPC ....... *H01L 29/0847* (2013.01); *H01L 21/3065* (2013.01); *H01L 21/823807* (2013.01); *H01L 21/823814* (2013.01); *H01L 27/092* (2013.01); *H01L 29/165* (2013.01); *H01L 29/1608* (2013.01); *H01L 29/24* (2013.01); *H01L 29/6656* (2013.01); *H01L 29/66553* (2013.01); *H01L 29/66636* (2013.01); *H01L 29/7848* (2013.01)

(58) Field of Classification Search
CPC ..................... H01L 29/7848; H01L 21/823807
See application file for complete search history.

(56) References Cited

U.S. PATENT DOCUMENTS

| | | | |
|---|---|---|---|
| 8,975,697 B2* | 3/2015 | Cheng | H01L 29/7849 257/347 |
| 2009/0075029 A1* | 3/2009 | Thomas | H01L 21/02381 428/173 |

(Continued)

*Primary Examiner* — Su C Kim
*Assistant Examiner* — Regan J Rundio
(74) *Attorney, Agent, or Firm* — Birch, Stewart, Kolasch & Birch, LLP

(57) ABSTRACT

A semiconductor structure and a method for forming the same are provided. The semiconductor structure includes a substrate and a first gate structure and a second gate structure formed over the substrate. The semiconductor structure further includes first recesses formed in the substrate adjacent to the first gate structure and first strained source and drain structures formed in the first recesses. The semiconductor structure further includes second recesses formed in the substrate adjacent to the second gate structure and second strained source and drain structures formed in the second recesses. In addition, each of the first recesses has a shape of a trapezoid, and each of the second recesses has a shape of an inverted trapezoid.

20 Claims, 9 Drawing Sheets

(51) Int. Cl.
  *H01L 29/66* (2006.01)
  *H01L 29/165* (2006.01)
  *H01L 29/16* (2006.01)
  *H01L 29/24* (2006.01)
  *H01L 21/3065* (2006.01)

(56) References Cited

U.S. PATENT DOCUMENTS

| | | |
|---|---|---|
| 2011/0147810 A1 | 6/2011 | Hsu et al. |
| 2011/0195548 A1 | 8/2011 | Yeh et al. |
| 2011/0318901 A1* | 12/2011 | Rotondaro ........ H01L 21/30608 438/400 |
| 2012/0056276 A1 | 3/2012 | Cheng et al. |
| 2012/0315733 A1 | 12/2012 | Huang et al. |
| 2014/0027824 A1* | 1/2014 | Park ........................ H01L 29/78 257/288 |

* cited by examiner

SEMICONDUCTOR STRUCTURE WITH STRAINED SOURCE AND DRAIN STRUCTURES AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the more important drivers for increased performance in semiconductor devices is the higher levels of integration of circuits. This is accomplished by miniaturizing or shrinking device sizes on a given chip. However, as technology nodes shrink, processing and manufacturing of these semiconductor devices becomes more and more challenging.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
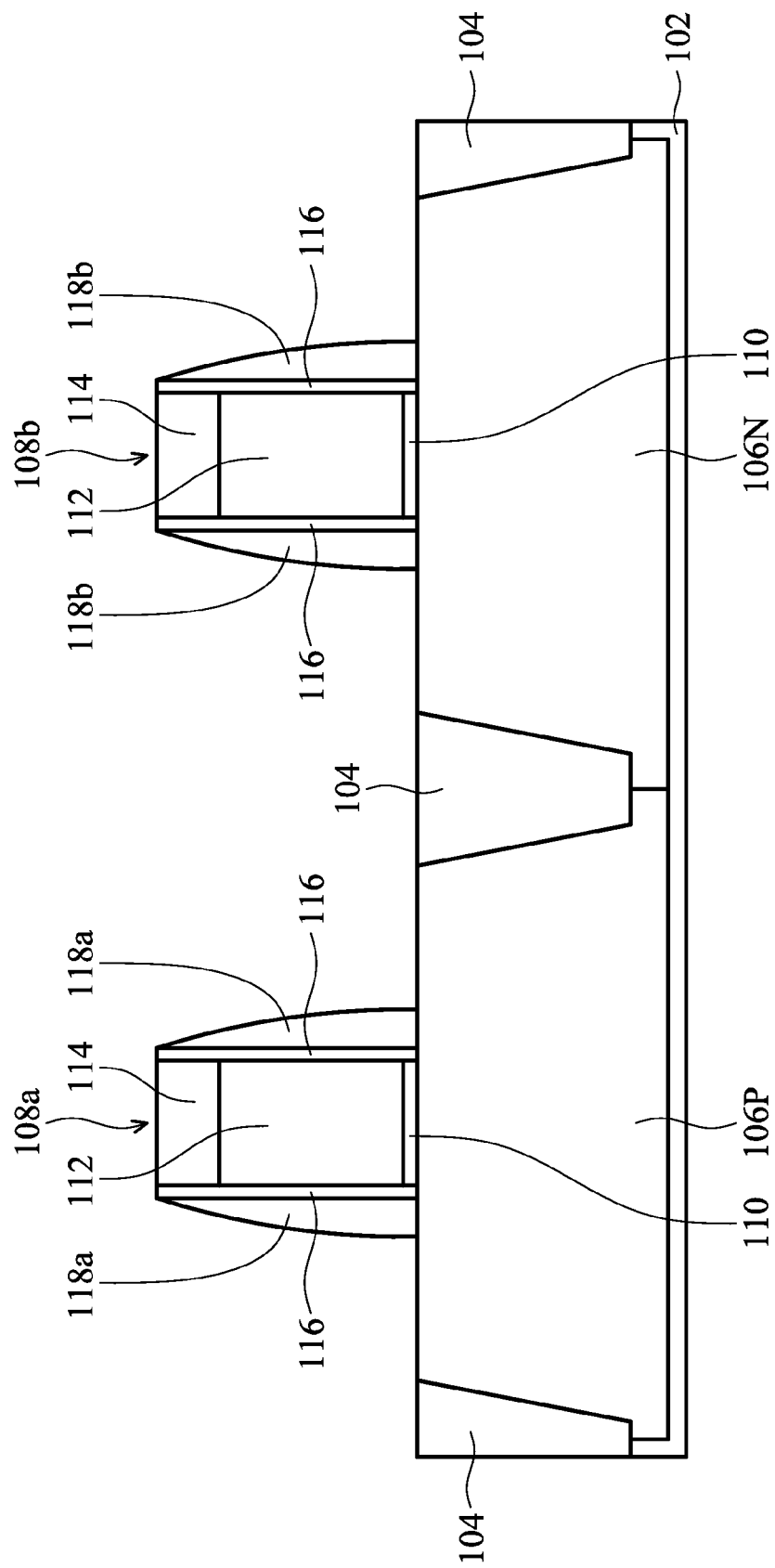
FIGS. 1A to 1I are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a semiconductor structure are provided in accordance with some embodiments of the disclosure. The semiconductor structure may include a first gate structure and a second gate structure. First strained source and drain structures are formed adjacent to the first gate structure, and second strained source and drain structures are formed adjacent to the second gate structure. In addition, the shape of the first strained source and drain structures is opposite to the shape of the second strained source and drain structures.

FIGS. 1A to 1I are cross-sectional representations of various stages of forming a semiconductor structure in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, and/or conductive features. Furthermore, substrate 102 may further include single or multiple material layers to be patterned. For example, the material layers may include a silicon layer, a dielectric layer, and/or a doped poly-silicon layer.

In some embodiments, isolation structures 104 are formed in substrate 102 to define various active regions in substrate 102. Isolation structures 104 electrically isolate neighboring devices (e.g., transistors) from one another. Isolation structures 104 include, for example, a silicon oxide, silicon nitride, silicon oxynitride, fluoride-doped silicate glass (FSG), a low-K dielectric material, or other applicable materials. Isolation structures 104 may be local oxidation of semiconductor (LOCOS) structures, shallow trench isolation (STI) structures, or the like. The formation of isolation structures 104 may include patterning substrate 102 by a photolithography process, etching trenches in substrate 102, and filling the trenches with dielectric materials. In some embodiments, isolation structures 104 include a thermal oxide liner layer and silicon nitride or silicon oxide formed on the liner layer.

A P-well region 106P and an N-well region 106N are formed in substrate 102, as shown in FIG. 1A in accordance with some embodiments. P-well region 106P and N-well region 106N may be formed by two separate processes. For example, a first implantation mask layer (not shown) may be formed to cover a first portion of substrate 102 but to expose a second portion of substrate 102. Next, a first ion implantation process may be performed on the second portion (i.e. the exposed portion) of substrate 102 to form P-well region 106P. In some embodiments, P-type dopants are implanted into P-well region 106P. Afterwards, the first implantation mask layer is removed.

After P-well region 106P is formed, a second implantation mask layer (not shown) may be formed to cover the second portion of substrate 102, including P-well region 106P, and to expose the first portion of substrate 102. Next, a second ion implantation process is performed to form N-well region 106N. In some embodiments, N-type dopants are implanted into N-well region 106N. Afterwards, the second implantation mask layer is removed. In some embodiments, an annealing process is performed to drive in the implanted dopants.

It should be noted that the sequence and processes for forming P-well region 106P and N-well region 106N are not limited to the sequence and processes described above. For example, N-well region 106N may be formed before P-well region 106P is formed. In addition, P-well region 106P may not be formed in substrate 102 when substrate 102 is a P-type semiconductor substrate. In contrast, N-well region 106N may not be formed when substrate 102 is an N-type semiconductor substrate.

A first gate structure 108a and a second gate structure 108b are formed over substrate 102, as shown in FIG. 1A in accordance with some embodiments. In some embodiments, first gate structure 108a and second gate structure 108b respectively include a gate dielectric layer 110, a gate electrode layer 112, and a mask layer 114. In some embodiments, gate dielectric layer 110 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

As shown in FIG. 1A, gate electrode layer 112 is formed over gate dielectric layer 110, and mask layer 114 is formed over gate electrode layer 112. In some embodiments, gate electrode layer 112 is made of polysilicon, metal, or metal silicide. In some embodiments, gate electrode layer 112 is a polysilicon layer which serves as a dummy gate that will be replaced in subsequent gate replacement processes. In some embodiments, gate electrode layer 112 is formed by using a CVD process. In some embodiments, mask layer 114a is a hard mask layer made of any applicable dielectric materials.

First gate structure 108a and second dummy gate structure 108b may be formed by a procedure including deposition, photolithography patterning, and etching processes. The deposition processes may include chemical vapor deposition (CVD), physical vapor deposition (PVD), atomic layer deposition (ALD), high density plasma CVD (HDP-CVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

It should be noted that first gate structure 108a and second gate structure 108b may be adjacent to each other or other structures may be formed between first gate structure 108a and second gate structure 108b, and the scope of the disclosure is not intended to be limiting.

After first gate structure 108a and second gate structure 108b are formed, a sealing layer 116 is formed on sidewalls of first gate structure 108a and second gate structure 108b, as shown in FIG. 1A in accordance with some embodiments. In some embodiments, sealing layer 116 is made of silicon nitride, silicon oxide, silicon oxynitride, or other applicable dielectric materials. Sealing layer 116 may be formed by depositing a dielectric layer over first gate structure 108a and second gate structure 108b and etching the dielectric layer afterwards. The dielectric layer may be formed by a CVD process and may be etched by a dry etching process. Sealing layer 116 may be used to protect first gate structure 108a and second gate structure 108b from being damaged during subsequent processes.

Next, first spacers 118a are formed on sealing layer 116 on the sidewalls of first gate structure 108a, and second spacers 118b are formed on sealing layer 118 on the sidewalls of second gate structure 108b, as shown in FIG. 1A in accordance with some embodiments. In some embodiments, first spacers 118a and second spacers 118b are made of silicon oxide, silicon nitride, silicon oxynitride, and/or other applicable dielectric materials. First spacers 118a and second spacers 118b may be formed by depositing one or multiple dielectric layers over substrate 102, and etching the dielectric layer. That is, first spacers 118a and second spacers 118b may be formed of a single layer or multiple layers.

Figure 1B:
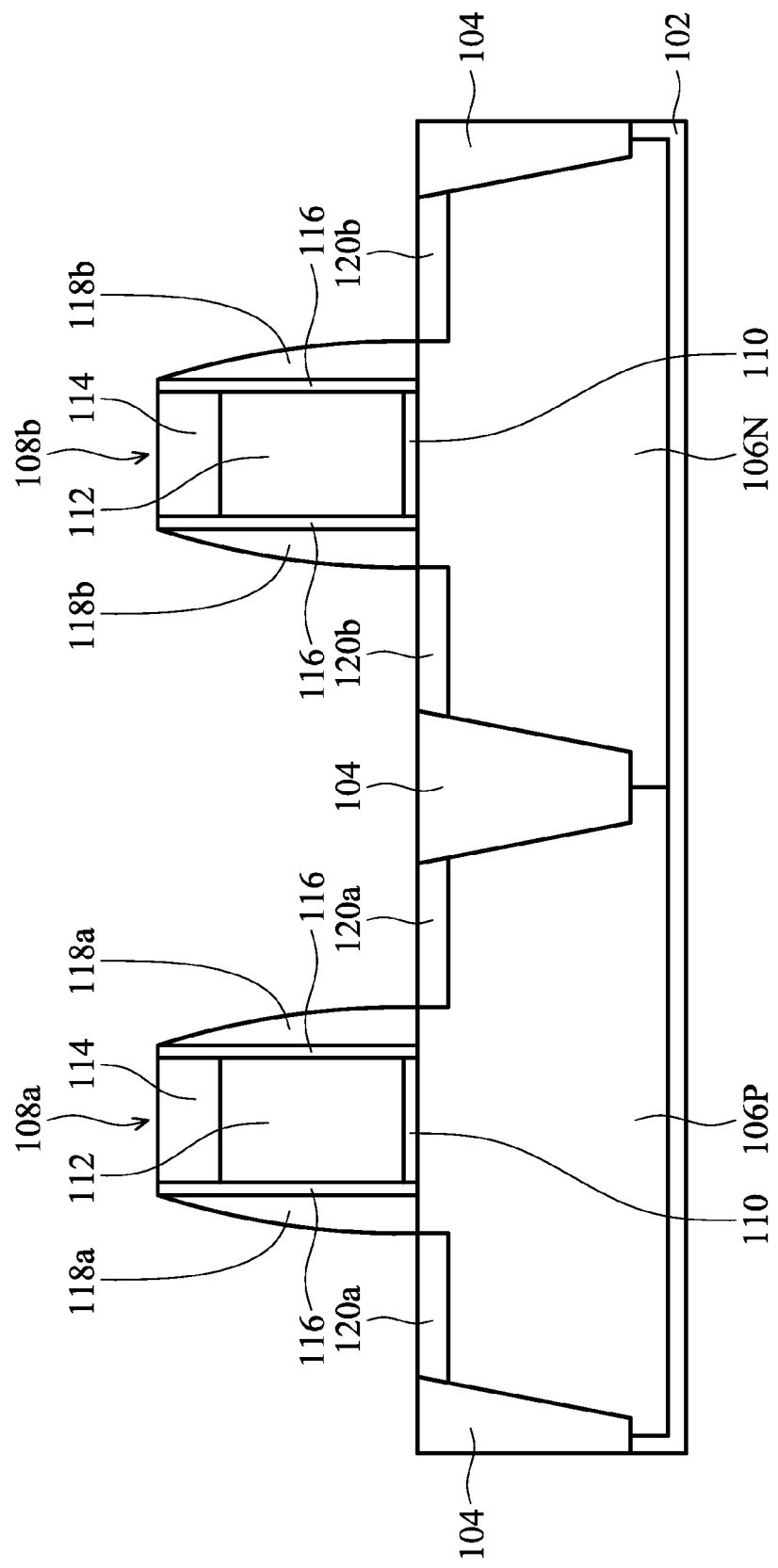

After first spacers 118a and second spacers 118b are formed, first doped regions 120a and second doped regions 120b are formed in substrate 102, as shown in FIG. 1B in accordance with some embodiments. More specifically, first doped regions 120a are formed adjacent to first spacers 118a in substrate 102, and second doped regions 120b are formed adjacent to second spacers 118b in substrate 102. In addition, first doped regions 120a and second doped regions 120b are formed separately in accordance with some embodiments.

In some embodiments, first doped regions 120a are formed by forming an implantation mask layer to cover N-well region 106N and implanting N-type dopants in substrate 102 adjacent to first spacers 118a. Similarly, second doped regions 120b are formed by forming an implantation mask layer to cover P-well region 106P and implanting P-type dopants in substrate 102 adjacent to second spacers 118b.

Figure 1C:
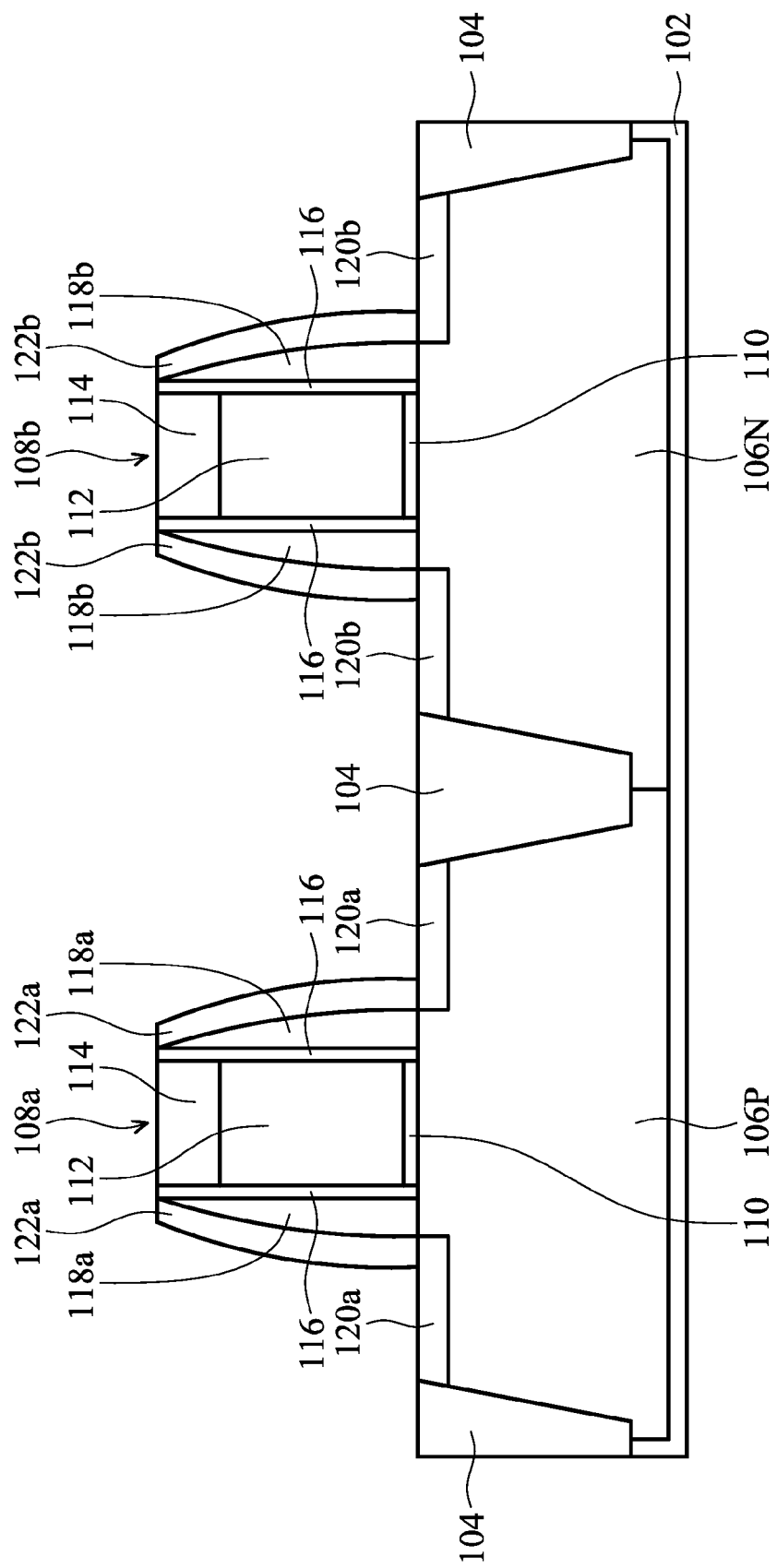

Next, first dummy spacers 122a are formed over first spacers 118a, and second dummy spacers 122b are formed over second spacers 118b, as shown in FIG. 1C in accordance with some embodiments. In some embodiments, first dummy spacers 122a and second dummy spacers 122b are made of silicon oxide, silicon nitride, silicon oxynitride, and/or other applicable dielectric materials. First dummy spacers 122a and second dummy spacers 122b may be formed by depositing one or multiple dielectric layers over substrate 102, and etching the dielectric layer.

Figure 1D:
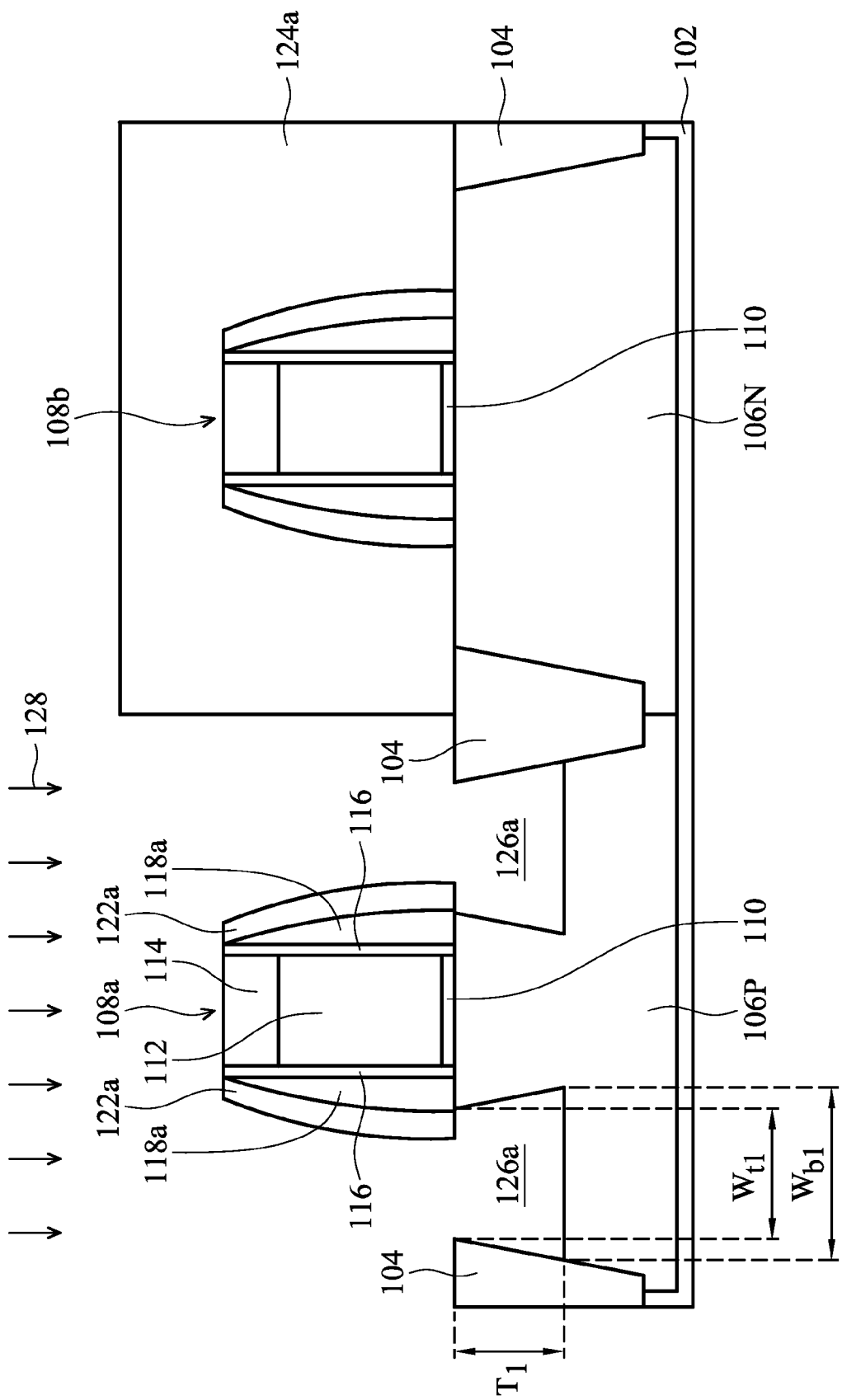

After first dummy spacers 122a and second dummy spacers 122b are formed, a first photoresist layer 124a is formed over N-well region 106N, and first recesses 126a are formed in P-well region 106P in substrate 102 afterwards, as shown in FIG. 1D in accordance with some embodiments. More specifically, first photoresist layer 124a is formed to cover N-well region 106N but not P-well region 106P. After first photoresist layer 124a is formed, portions of substrate 102 in P-well region 106P are etched to form first recesses 126a by performing a first etching process 128.

In some embodiments, first etching process 128 includes a dry etching process and a wet etching process. In some embodiments, first etching process 128 is performed under a bias voltage in a range of about 0 to about 200 Volt. In some embodiments, first etching process 128 is performed under a relatively low pressure, such as lower than 30 mT.

In some embodiments, first etching process 128 includes using an etching gas such as HBr, NF$_3$, Cl$_2$, CF$_4$, CH$_3$F, or the like.

As shown in FIG. 1D, each of first recesses 126a formed in P-well region 106P has a trapezoidal shape in accordance with some embodiments. First recesses 126a being trapezoidal in shape enable improve the performance of the semiconductor structure (the details will be described later). In addition, first recesses 126a extend below first spacers 118a and first dummy spacers 122a in accordance with some embodiments.

In some embodiments, each of first recesses 126a has a first top width $W_{t1}$ and a first bottom width $W_{b1}$ that is larger than first top width $W_{t1}$. In some embodiments, a ratio of first top width $W_{t1}$ to first bottom width $W_{b1}$ is in a range from about 1 to about 0.3. When the ratio of first top width $W_{t1}$ to first bottom width $W_{b1}$ is too great, leakage may happen via well and/or Ion, Isat may degrade. When the ratio of first top width $W_{t1}$ to first bottom width $W_{b1}$ is too low, Ion, Isat may degrade and Vt shift may occur.

In some embodiments, first top width $W_{t1}$ of first recess 126a is in a range from about 1 nm to about 30 nm. In some embodiments, first bottom width $W_{b1}$ of first recess 126a is in a range from about 1 nm to about 90 nm. In some embodiments, each first recess 126a has a first thickness $T_1$ in a range from about 1 nm to about 100 nm.

Figure 1E:
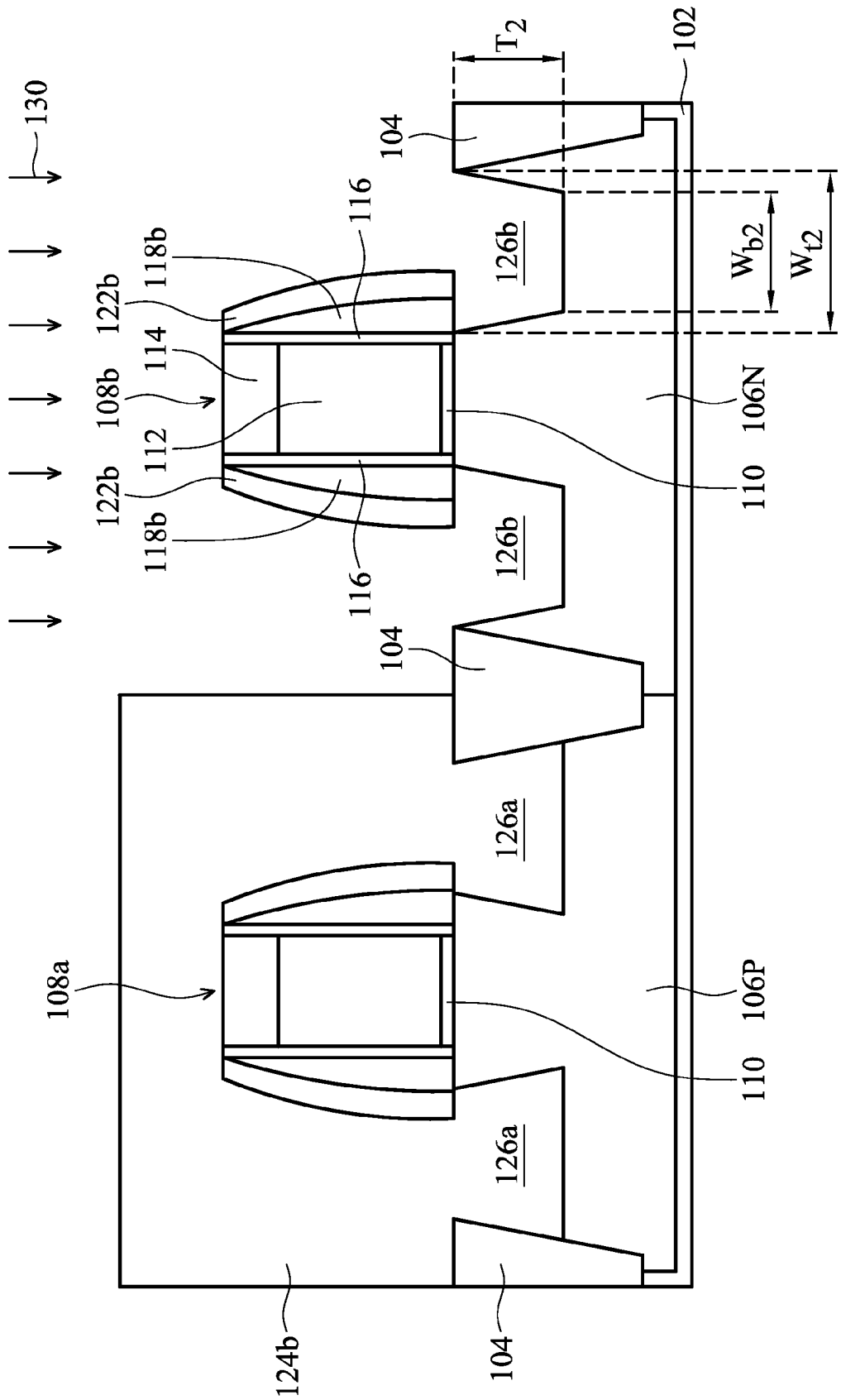

After first recesses 126a are formed, first photoresist layer 124a is removed. Afterwards, a second photoresist layer 124b is formed over over P-well region 106P, and second recesses 126b are formed in N-well region 106N in substrate 102 afterwards, as shown in FIG. 1E in accordance with some embodiments. More specifically, second photoresist layer 124b is formed to cover P-well region 106P (including first recesses 126a) but not N-well region 106N. After second photoresist layer 124b is formed, portions of substrate 102 in N-well region 106N are etched to form second recesses 126b by performing a second etching process 130.

In some embodiments, second etching process 130 includes a dry etching process and a wet etching process. In some embodiments, second etching process 130 is performed under a bias voltage in a range from about 0 to about 200 Volt. In some embodiments, second etching process 130 is performed under a relatively higher pressure, such as larger than 30 mT. In some embodiments, second etching process 130 includes using an etching gas such as HBr, NF$_3$, Cl$_2$, CF$_4$, CH$_3$F, or the like.

As shown in FIG. 1E, each of second recesses 126b formed in N-well region 106N is shaped as an inverted trapezoid in accordance with some embodiments. That is, the shape of second recess 126b may be similar to the shape of first recess 126a, but upside down. Second recesses 126b being an inverted trapezoid in shape enable the performance of the semiconductor structure to be improved (the details will be described later). In addition, second recesses 126b extend below second spacers 118b and second dummy spacers 122b in accordance with some embodiments.

In some embodiments, each of second recesses 126b has a second top width $W_{t2}$ and a second bottom width $W_{b2}$ that is smaller than second top width $W_{t2}$. In some embodiments, a ratio of second top width $W_{t2}$ to second bottom width $W_{b2}$ is in a range from about 3 to about 1. When the ratio of second top width $W_{t2}$ to second bottom width $W_{b2}$ is too great, it may be punched through Ioff, and/or leakage may happen via channel. When the ratio of second top width $W_{t2}$ to second bottom width $W_{b2}$ is too low, Ion, Isat performance may be degraded.

In some embodiments, second top width $W_{t2}$ of second recess 126b is in a range from about 1 nm to about 90 nm. In some embodiments, second bottom width $W_{b2}$ of second recess 126b is in a range from about 1 nm to about 30 nm. In some embodiments, each second recess 126a has a second thickness $T_2$ in a range from about 1 nm to about 100 nm.

Figure 1F:
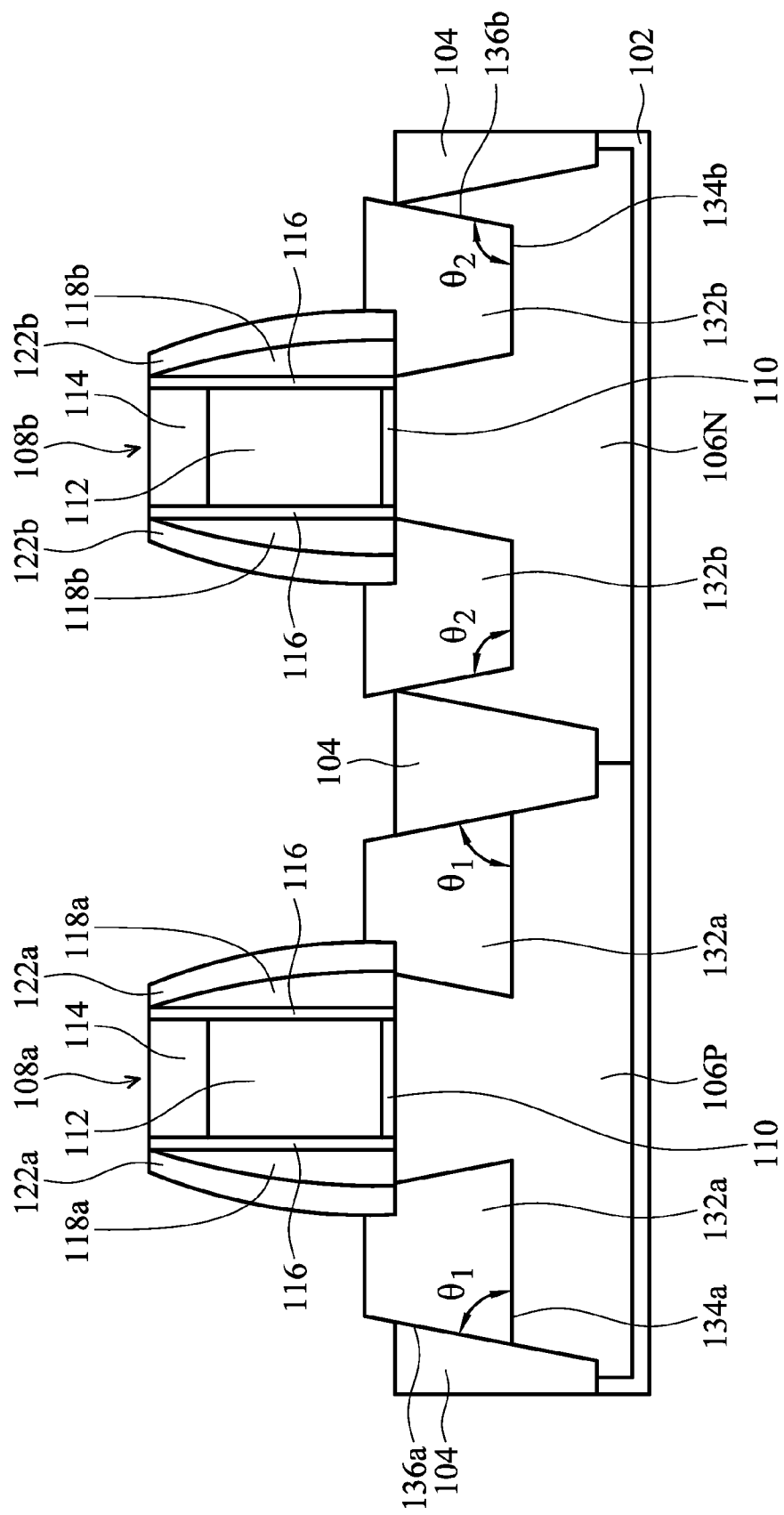

After second recesses 126b are formed, second photoresist layer 124b is removed. Next, first strained source and drain structures 132a and second strained source and drain structures 132b are formed, as shown in FIG. 1F in accordance with some embodiments. First strained source and drain structures 132a and second strained source and drain structures 132b are used to provide stress to the channel region under first gate structure 108a and second gate structure 108b so as to increase the carrier mobility.

First strained source and drain structures 132a and second strained source and drain structures 132b are respectively made of a first semiconductor material and a second semiconductor material, and the first and second semiconductor materials are different from the material used to form substrate 102. In addition, the first semiconductor material is also different from the second semiconductor material. That is, first strained source and drain structures 132a and second strained source and drain structures 132b may be formed separately by various processes.

In some embodiments, first strained source and drain structures 132a are made of silicon germanium (SiGe). In some embodiments, first strained source and drain structures 132a are formed by an epitaxy or epitaxial (epi) process. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, or other applicable epi processes. The epi process may use gaseous and/or liquid precursors, which may interact with the composition of substrate 102. In some embodiments, first strained source and drain structures 132a are formed by epitaxially growing SiGe in first recesses 126a in P-well region 106P.

First strained source and drain structures 132a may be in-situ doped or undoped during the epi process. For example, first strained source and drain structures 132a may be doped by an ion implantation process, plasma immersion ion implantation (PIII) process, gas and/or solid source diffusion process, or other applicable processes. When first strained source and drain structures 132a are not doped during the epi process, they may be doped in subsequent processes. In some embodiments, an annealing process, such as a rapid thermal annealing process, is performed on first strained source and drain structures 132a.

In some embodiments, second strained source and drain structures 132b are made of silicon carbide (SiC) or silicon phosphide (SiP). In some embodiments, second strained source and drain structures 132b are formed by an epitaxy or epitaxial (epi) process. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, or other applicable epi processes. The epi process may use gaseous and/or liquid precursors, which may interact with the composition of substrate 102. In some embodiments, second strained source and drain structures 132b are formed by epitaxially growing SiC or SiP in second recesses 126b in N-well region 106N.

Second strained source and drain structures 132b may be in-situ doped or undoped during the epi process. For example, second strained source and drain structures 132b may be doped by an ion implantation process, plasma immersion ion implantation (PIII) process, gas and/or solid source diffusion process, or other applicable process. When second strained source and drain structures 132b are not doped during the epi process, they may be doped in subsequent processes. In some embodiments, an annealing process, such as a rapid thermal annealing process, is performed on second strained source and drain structures 132b.

As shown in FIG. 1F, each first strained source and drain structure 132a formed in first recess 126a also substantially has the shape of a trapezoid, and each second strained source and drain structure 132b formed in second recess 126b also substantially has the shape of an inverted trapezoid in accordance with some embodiments.

More specifically, each first strained source and drain structure 132a has a first bottom surface 134a and a first sidewall 136a, and an angle $\theta_1$ between first bottom surface 134a and first sidewall 136a is smaller than 90°. In some embodiments, angle $\theta_1$ between first bottom surface 134a and first sidewall 136a is in a range from about 1° to about 89°. When angle $\theta_1$ is too large, leakage may happen and/or Ioff may increase. When angle $\theta_1$ is too small, Ion (Isat) may be degraded.

Similarly, each second strained source and drain structure 132b has a second bottom surface 134b and a second sidewall 136b, and an angle $\theta_2$ between first bottom surface 134a and first sidewall 136a is larger than 90°. In some embodiments, angle $\theta_2$ between second bottom surface 134a and second sidewall 136a is in a range from about 91° to about 179°. When angle $\theta_2$ is too large, leakage and Ioff may increase. When angle $\theta_2$ is too small, Ion (Isat) degradation may happen.

In addition, as shown in FIG. 1F, a top surface of first strained source and drain structures 132a and the top surface of second strained source and drain structures 132b are raised above a top surface of substrate 102 in accordance with some embodiments. Therefore, first strained source and drain structures 132a and second strained source and drain structures 132b may alternatively be referred to as raised source and drain structures.

As described previously, first recesses 126a extend below first spacers 118a and first dummy spacers 122a, and therefore first strained source and drain structures 132a formed in first recesses 126a also extend below first spacers 118a and first dummy spacers 122a in accordance with some embodiments. In addition, in some embodiments, first strained source and drain structures 132a are in direct contact with first spacers 118a and first dummy spacers 122a.

Similarly, second recesses 126b extend below second spacers 118b and second dummy spacers 122b, and therefore second strained source and drain structures 132b formed in second recesses 126b also extend below second spacers 118b and second dummy spacers 122b in accordance with some embodiments. In addition, in some embodiments, second strained source and drain structures 132b are in direct contact with second spacers 118b and second dummy spacers 122b.

Figure 1G:
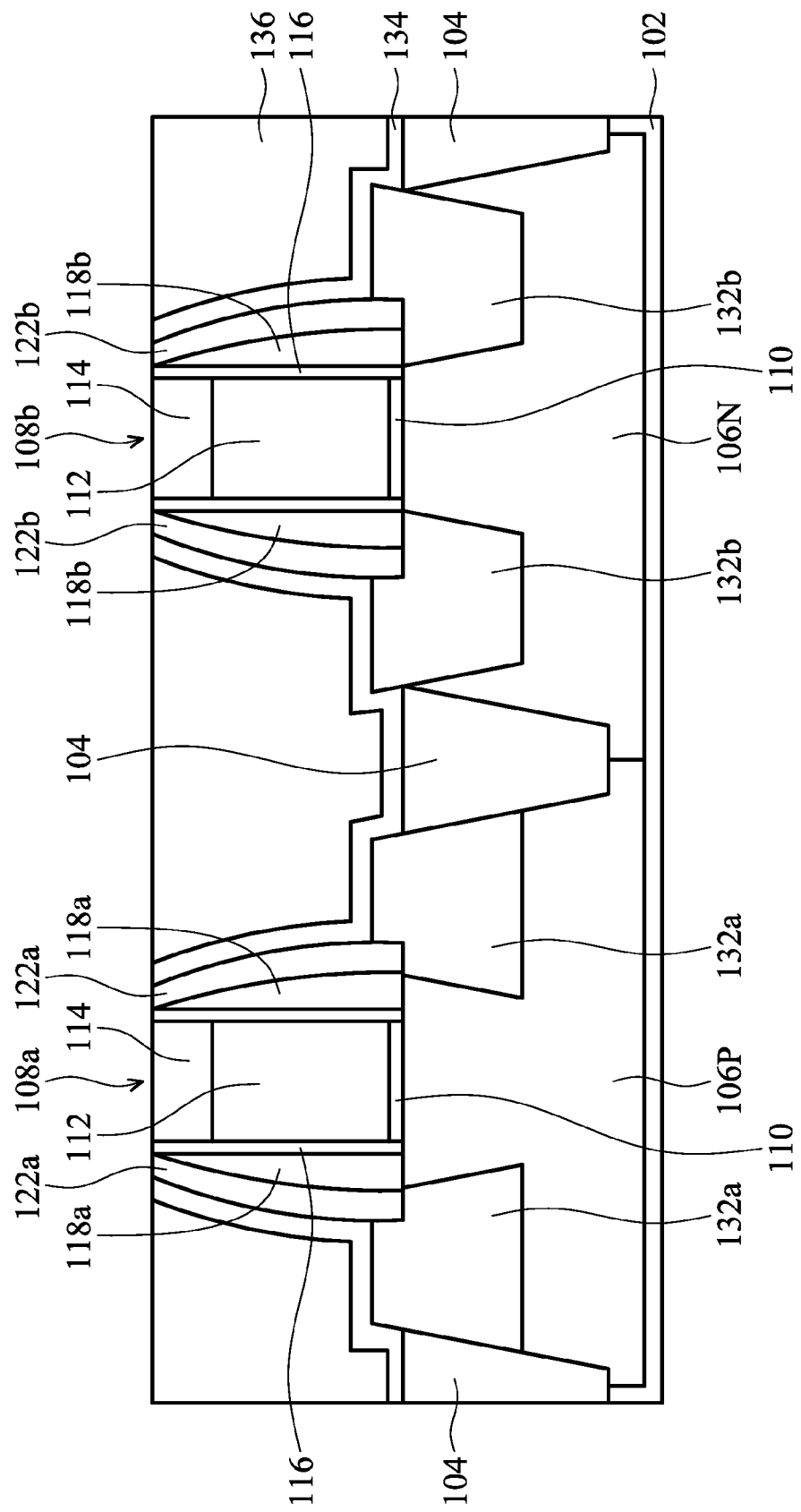

After first strained source and drain structure 132a and second strained source and drain structure 132b are formed, a contact etch stop layer (CESL) 134 is formed to cover first gate structure 108a and second gate structure 108b over substrate 102, as shown in FIG. 1G in accordance with some embodiments. In some embodiments, contact etch stop layer 134 is made of silicon nitride, silicon oxynitride, and/or other applicable materials. Contact etch stop layer 134 may be formed by plasma enhanced CVD, low pressure CVD, ALD, or other applicable processes.

After contact etch stop layer 134 is formed, an inter-layer dielectric (ILD) layer 136 is formed on contact etch stop layer 134 over substrate 102 in accordance with some embodiments. Inter-layer dielectric layer 136 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 128 may be formed by chemical vapor deposition (CVD), physical vapor deposition, (PVD), atomic layer deposition (ALD), spin-on coating, or other applicable processes.

Afterwards, a polishing process is performed to expose the top surface of first gate structure 108a and the top surface of second gate structure 108b, as shown in FIG. 1G in accordance with some embodiments. In some embodiments, inter-layer dielectric layer 136 is planarized by a chemical mechanical polishing (CMP) process until the top surfaces of mask layer 114 of first gate structure 108a and the top surfaces of mask layer 114 of second gate structure 108b are exposed.

Figure 1H:
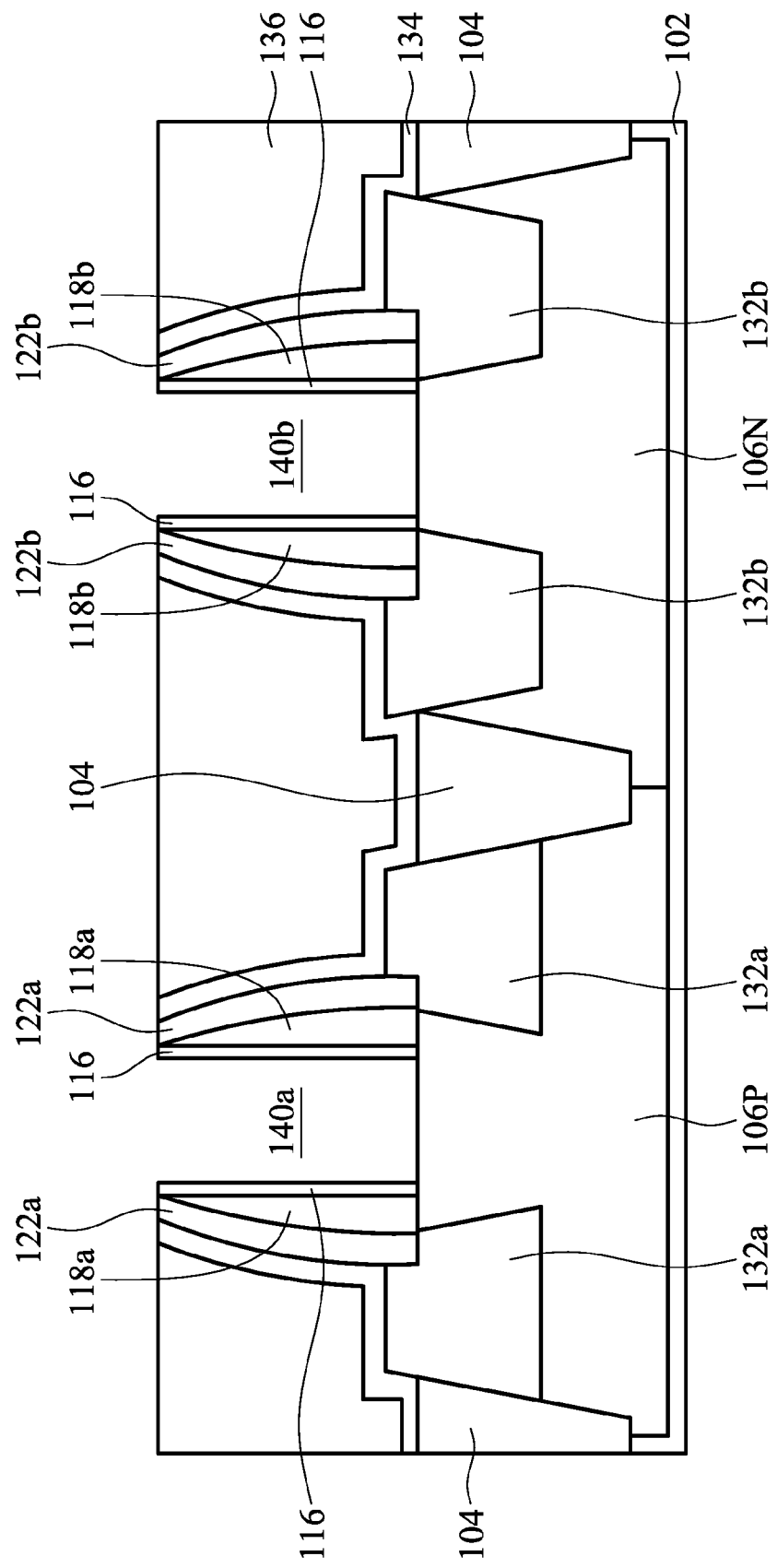

After the polishing process is performed, first gate structure 108a is replaced by a first metal gate structure 138a, and second gate structure 108b is replaced by a second metal gate structure 138b. More specifically, first gate structure 108a and second gate structure 108b are removed to form first trench 140a and second trench 140b, as shown in FIG. 1H in accordance with some embodiments.

Mask layer 114 may be removed by a first etching process, and gate electrode layer 112 may be removed by a second etching process. In addition, gate dielectric layer 110 may be removed by a third etching process after the first and second etching processes are performed. It should be noted that although gate dielectric layer 110 is removed in the embodiments shown in FIG. 1H, it may not be removed in other cases.

Figure 1I:
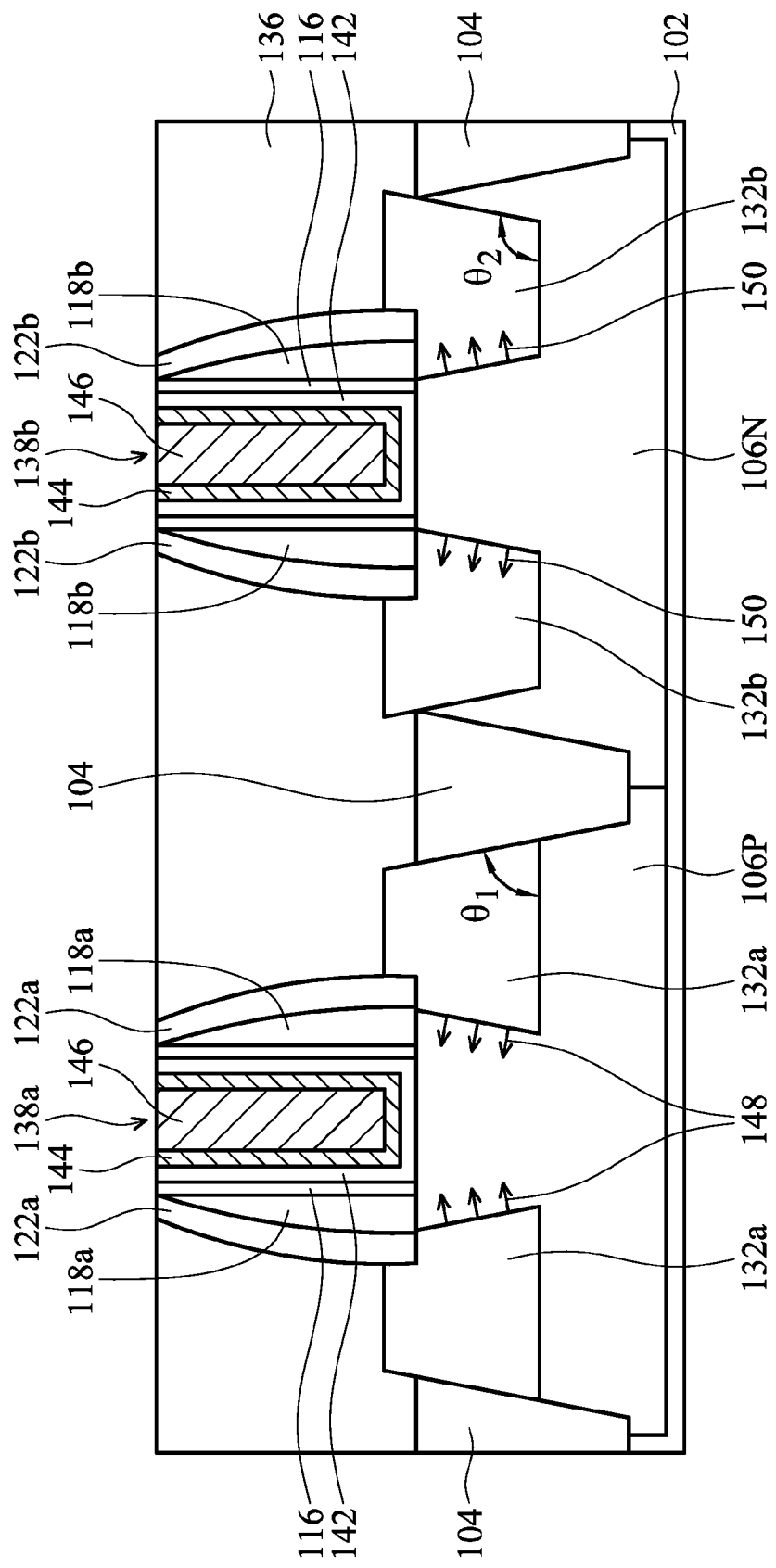

After first gate structure 108a and second gate structure 108b are removed, first metal gate structure 138a and second metal gate structure 138b are formed in first trench 140a and second trench 140b respectively, as shown in FIG. 1I in accordance with some embodiments.

In some embodiments, first metal gate structure 138a and second metal gate structure 138b respectively include a high-k dielectric layer 142, a work function metal layer 144, and a metal gate electrode layer 146. In some embodiments, high-k dielectric layer 142 is made of high k dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 144 is formed over high-k dielectric layer 142 in accordance with some embodiments. Work function metal layer 144 is tuned to have the proper work function. For example, if an N-type work function metal (N-metal) for NMOS devices is desired, N-type metal materials may be used. In some embodiments, work function metal layer 144 in first metal gate structure 138a is made of N-type work function materials. Examples of the N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

On the other hand, if a P-type work function metal (P-metal) for a PMOS device is desired, P-type work function materials may be used. In some embodiments, work function metal layer 144 in second metal gate structure 138b is made of P-type work function materials. Examples of the P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

It should be noted that work function metal layer 144 may be a single layer or may include multiple layers made of various work function materials, although only one layer is shown in FIG. 1I, and the scope of the disclosure is not intended to be limiting.

Metal gate electrode layer 146 is formed over work function metal layer 144 in accordance with some embodiments. In some embodiments, metal gate electrode layer 146 is made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. High-k dielectric layer 142, work function metal layer 144, and metal gate electrode layer 146 may be formed by any applicable process to any applicable thickness.

It should be noted that additional layers may be formed above and/or below high-k dielectric layer 142, work function metal layer 144, and metal gate electrode layer 138, such as liner layers, interface layers, seed layers, adhesion layers, barrier layers, or the like. In addition, high-k dielectric layer 142, work function metal layer 144, and metal gate electrode layer 146 may include one or more materials and/or one or more layers.

Furthermore, although first gate structure 108a and second gate structure 108b are replaced by first metal gate structure 138a and second metal gate structure 138b in the embodiments shown in FIG. 1A to 1I, these processes may be omitted. That is, first gate structure 108a and second gate structure 108b are not replaced by first metal gate structure 138a and second metal gate structure 138b in some other embodiments, and the scope of the disclosure is not intended to be limiting.

Since the electrical performance of a semiconductor device is highly affected by its strained source and drain structure, the formation of a strained source and drain structure plays an important role in forming a semiconductor structure. When the strained source and drain structures formed in both NMOS and PMOS devices have the same shape, such as diamond shape, it may not benefit both PMOS and NMOS devices. Therefore, the embodiments described above provide methods for forming strained source and drain structures, which are designed to improve the carrier mobility in different types of devices.

As shown in FIGS. 1D and 1E and described previously, first recesses 126a are formed in P-well region 106P by first etching process 128, and second recesses 126b are formed in N-well region 106N by second etching process 130. That is, the shapes of first recesses 126a and second recesses 126b are separately and precisely controlled by first etching process 128 and second etching process 130, such that each first recess 126a is trapezoidal in shape and each second recess 126b is an inverted trapezoid in shape. The shapes of first recesses 126a and second recesses 126b are designed to concentrate the stress of first strained source and drain structures 132a and second strained source and drain structures 132b.

More specifically, first strained source and drain structures 132a formed in first recesses 126a are made of SiGe, which will induce a compressive stress 148 to the channel below first metal gate structure 138a, as shown in FIG. 1I in accordance with some embodiments. In addition, since first strained source and drain structures 132a are formed in first recesses 126a, first strained source and drain structures 132a are also trapezoidal in shape. Accordingly, the compressive stress 148 (e.g. a compressive force vertical to the sidewall of first strained source and drain structures 132a) can be concentrated to the channel below first metal gate structure 138a.

In addition, second strained source and drain structures 132b formed in second recesses 126b are made of SiC or SiP, which will induce a tensile stress 150 to the channel below second metal gate structure 138b, as shown in FIG. 1I in accordance with some embodiments. In addition, since second strained source and drain structures 132b are formed in second recesses 126b, second strained source and drain structures 132b are also inverted trapezoids in shape. Accordingly, the tensile stress 150 (e.g. a tensile force vertical to the sidewall of second strained source and drain structures 132b) can be concentrated to the channel below second metal gate structure 138b. As a result, the carrier mobility in first metal gate structure 138a and in second metal gate structure 138b are both improved.

As described above, the shapes of first strained source and drain structures 132a and second strained source and drain structures 132b are precisely controlled by first etching process 128 and second etching process 130, and therefore the uniformity of the resulting first strained source and drain structures 132a and second strained source and drain structures 132b are also improved, compared to those formed by an isotropic wet etching process.

Embodiments for forming a semiconductor structure are provided. The semiconductor structure includes a first gate structure and a second gate structure. First strained source and drain structures are formed adjacent to the first gate structure, and each first strained source and drain structure is shaped like a trapezoid. The first strained source and drain structure having the trapezoidal shape enables concentrating compressive stress to the channel below the first gate structure. In addition, second strained source and drain structures are formed adjacent to the second gate structure, and each second strained source and drain structure has the shape of an inverted trapezoid. The second strained source and drain structure having the inverted trapezoid shape enable concentrating tensile stress to the channel below the second gate structure. Accordingly, the carrier mobility of the semiconductor structure can be improved.

In some embodiments, a semiconductor structure is provided. The semiconductor structure includes a substrate and a first gate structure and a second gate structure formed over the substrate. The semiconductor structure further includes first recesses formed in the substrate adjacent to the first gate structure and first strained source and drain structures formed in the first recesses. The semiconductor structure further includes second recesses formed in the substrate adjacent to the second gate structure and second strained source and drain structures formed in the second recesses. In addition, each of the first recesses has a shape of a trapezoid, and each of the second recesses has a shape of an inverted trapezoid.

In some embodiments, a semiconductor structure is provided. The semiconductor structure includes a substrate and a first gate structure and a second gate structure formed over the substrate. The semiconductor structure further includes first strained source and drain structures formed in the substrate adjacent to the first gate structure. In addition, each of the first strained source and drain structures has a first bottom surface and a first sidewall, and a first angle between the first bottom surface and the first sidewall is smaller than 90°. The semiconductor structure further includes second strained source and drain structures formed in the substrate adjacent to the second gate structure. In addition, each of the second strained source and drain structures has a second bottom surface and a second sidewall, and a second angle between the second bottom surface and the second sidewall is larger than 90°.

In some embodiments, a method for forming a semiconductor structure is provided. The method for forming a semiconductor structure includes forming a first gate structure and a second gate structure over a substrate and forming first spacers over sidewalls of the first gate structure and second spacers over sidewalls of the second gate structure. The method for forming a semiconductor structure further includes etching the substrate to form first recesses adjacent to the first spacers, such that each of the first recesses has a shape of a trapezoid. The method for forming a semiconductor structure further includes etching the substrate to form second recesses adjacent to the first spacers, such that each of the second recesses has a shape of an inverted trapezoid. The method for forming a semiconductor structure further includes forming first strained source and drain structures in the first recesses and forming second strained source and drain structures in the first recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a first gate structure and a second gate structure formed over the substrate;
first recesses formed in the substrate adjacent to the first gate structure;
first strained source and drain structures formed in the first recesses;
second recesses formed in the substrate adjacent to the second gate structure; and
second strained source and drain structures formed in the second recesses,
wherein each of the first strained source and drain structures within the first recesses has a shape of a trapezoid, and each of the second strained source and drain structures within the second recesses has a shape of an inverted trapezoid, two angles between two sidewalls and a bottom surface of the trapezoid of the first strained source and drain structures within the first recesses are smaller than 90°, and a top surface of the first strained source and drain structures is raised above a top surface of the substrate.

2. The semiconductor structure as claimed in claim 1, wherein each of the first strained source and drain structures within the first recesses has a first top width and a first bottom width greater than the first top width, and each of the second strained source and drain structures within the second recesses has a second top width and a second bottom width less than the second top width.

3. The semiconductor structure as claimed in claim 2, wherein a ratio of the first top width to the first bottom width is in a range from about 1 to about 0.3, and a ratio of the second top width to the second bottom width is in a range from about 3 to about 1.

4. The semiconductor structure as claimed in claim 1, wherein each of the first strained source and drain structures has a first bottom surface and a first sidewall, and a first angle between the first bottom surface and the first sidewall is in a range from 1° to 89°.

5. The semiconductor structure as claimed in claim 1, wherein each of the second strained source and drain structures has a second bottom surface and a second sidewall, and a second angle between the second bottom surface and the second sidewall is in a range from 91° to 179°.

6. The semiconductor structure as claimed in claim 1, wherein the first strained source and drain structures are made of SiGe, and the second strained source and drain structures are made of SiP or SiC.

7. The semiconductor structure as claimed in claim 1, further comprising:
first spacers formed on sidewalls of the first gate structure;
second spacers formed on sidewalls of the second gate structure;
first dummy spacers formed on the first spacers; and
second dummy spacers formed on the second spacers,
wherein the first strained source and drain structures extend below the first spacers and the first dummy spacers, and the second strained source and drain structures extend below the second spacers and the second dummy spacers.

8. The semiconductor structure as claimed in claim 7, wherein the first strained source and drain structures are in direct contact with the first spacers and the first dummy spacers, and the second strained source and drain structures are in direct contact with the second spacers and the second dummy spacers.

9. A semiconductor structure, comprising:
a substrate;
a first gate structure and a second gate structure formed over the substrate;
first strained source and drain structures formed in the substrate adjacent to the first gate structure, wherein each of the first strained source and drain structures has a first top surface, a first bottom surface, a first sidewall and a second sidewall opposite to the first sidewall, and first angles between the first bottom surface and the first sidewall and between the first bottom surface and the second sidewall are smaller than 90°, the first top surface is parallel with the first bottom surface, and the first top surface is raised above a top surface of the substrate; and
second strained source and drain structures formed in the substrate adjacent to the second gate structure, wherein each of the second strained source and drain structures has a second bottom surface, a third sidewall and a fourth sidewall opposite to the third sidewall, and second angles between the second bottom surface and the third sidewall and between the second bottom surface and the fourth sidewall are larger than 90°.

10. The semiconductor structure as claimed in claim 9, wherein the first angles are in a range from 1° to 89°.

11. The semiconductor structure as claimed in claim 9, wherein the second angles are in a range from 91° to 179°.

12. The semiconductor structure as claimed in claim 9, wherein the first strained source and drain structures are made of SiGe, and the second strained source and drain structures are made of SiP or SiC.

13. The semiconductor structure as claimed in claim 9, further comprising:
   first spacers formed on sidewalls of the first gate structure;
   second spacers formed on sidewalls of the second gate structure;
   first dummy spacers formed on the first spacers; and
   second dummy spacers formed on the second spacers,
   wherein the first strained source and drain structures extend below the first spacers and the first dummy spacers and are in direct contact with the first spacers and the first dummy spacers, and the second strained source and drain structures extend below the second spacers and the second dummy spacers and are in direct contact with the second spacers and the second dummy spacers.

14. A method for forming a semiconductor structure, comprising:
   forming a first gate structure and a second gate structure over a substrate;
   forming first recesses in the substrate adjacent to the first gate structure;
   forming second recesses in the substrate adjacent to the second gate structure;
   forming first strained source and drain structures in the first recesses, wherein each of the first strained source and drain structures within the first recesses has a shape of a trapezoid, two angles between two sidewalls and a bottom surface of the trapezoid of the first strained source and drain structures are smaller than 90°, and a top surface of the first strained source and drain structures is raised above a top surface of the substrate; and
   forming second strained source and drain structures in the second recesses, wherein each of the second strained source and drain structures within the second recesses has a shape of an inverted trapezoid.

15. The method for forming a semiconductor structure as claimed in claim 14, further comprising:
   framing first doped regions in the substrate adjacent to the first gate structure before forming the first recesses; and
   forming second doped regions in the substrate adjacent to the second gate structure before forming the second recesses.

16. The method for forming a semiconductor structure as claimed in claim 14, wherein forming first strained source and drain structures further comprises:
   epitaxially growing SiGe in the first recesses.

17. The method for forming a semiconductor structure as claimed in claim 16, wherein forming second strained source and drain structures further comprises:
   epitaxially growing SiC or SiP in the second recesses.

18. The method for forming a semiconductor structure as claimed in claim 14, wherein each of the first strained source and drain structures within the first recesses has a first top width and a first bottom width greater than the first top width, and a ratio of the first top width to the first bottom width is in a range from about 1 to about 0.3.

19. The method for forming a semiconductor structure as claimed in claim 14, wherein each of the second strained source and drain structures within the second recesses has a second top width and a second bottom width less than the second top width, and a ratio of the second top width to the second bottom width is in a range from about 3 to about 1.

20. The method for forming a semiconductor structure as claimed in claim 14, further comprising:
   forming first spacers over sidewalls of the first gate structure and second spacers over sidewalls of the second gate structure before forming the first recesses and the second recesses;
   forming first dummy spacers over the first spacers and second dummy spacers over the second spacers,
   wherein the first strained source and drain structures extend below the first spacers and the first dummy spacers and are in direct contact with the first spacers and the first dummy spacers, and the second strained source and drain structures extend below the second spacers and the second dummy spacers and are in direct contact with the second spacers and the second dummy spacers.

* * * * *